United States Patent

Yaffe et al.

Patent Number: 5,818,333
Date of Patent: Oct. 6, 1998

[54] DEVICE FOR WARNING OF VEHICLE BATTERY DETERIORATION

[76] Inventors: Yacob Yaffe, 1 Levi Eshkol, Yehud; Amos Zur, 6 Uberman, Petach Tikva, both of Israel

[21] Appl. No.: 843,375

[22] Filed: Apr. 15, 1997

Related U.S. Application Data

[63] Continuation of Ser. No. 625,497, Mar. 29, 1996, abandoned.

[30] Foreign Application Priority Data

Apr. 25, 1995 [IL] Israel ......................................... 113477

[51] Int. Cl.$^6$ .................................................... G08B 21/00
[52] U.S. Cl. ........................ 340/455; 340/636; 340/660; 324/433
[58] Field of Search ...................................... 340/455, 636, 340/663, 693, 333, 660; 324/426, 428, 433

[56] References Cited

U.S. PATENT DOCUMENTS

| | | | |
|---|---|---|---|
| 3,997,888 | 12/1976 | Kremer | 340/636 |
| 4,193,026 | 3/1980 | Finger et al. | 324/428 |
| 4,237,412 | 12/1980 | Randlof | 322/28 |
| 4,943,777 | 7/1990 | DeKamura et al. | 340/636 |

*Primary Examiner*—Edward Lefkowitz
*Attorney, Agent, or Firm*—Mark M. Friedman

[57] ABSTRACT

A device for warning of deterioration of a starter mechanism in which a motor is powered by a battery to start a combustion engine. The device includes a timer responsive to activation of the starter mechanism to time a given time interval, a voltage level tester for measuring a voltage across the battery at the end of the given time interval, a counter for maintaining an incremental count of occasions on which the voltage is below a given level, and an alarm unit for providing a warning signal when the incremental count exceeds a given number. In a preferred embodiment, the voltage level tester measures the voltage across the battery continuously, and the timer identifies activation of the starter mechanism by a corresponding sudden drop in voltage across the battery.

15 Claims, 1 Drawing Sheet

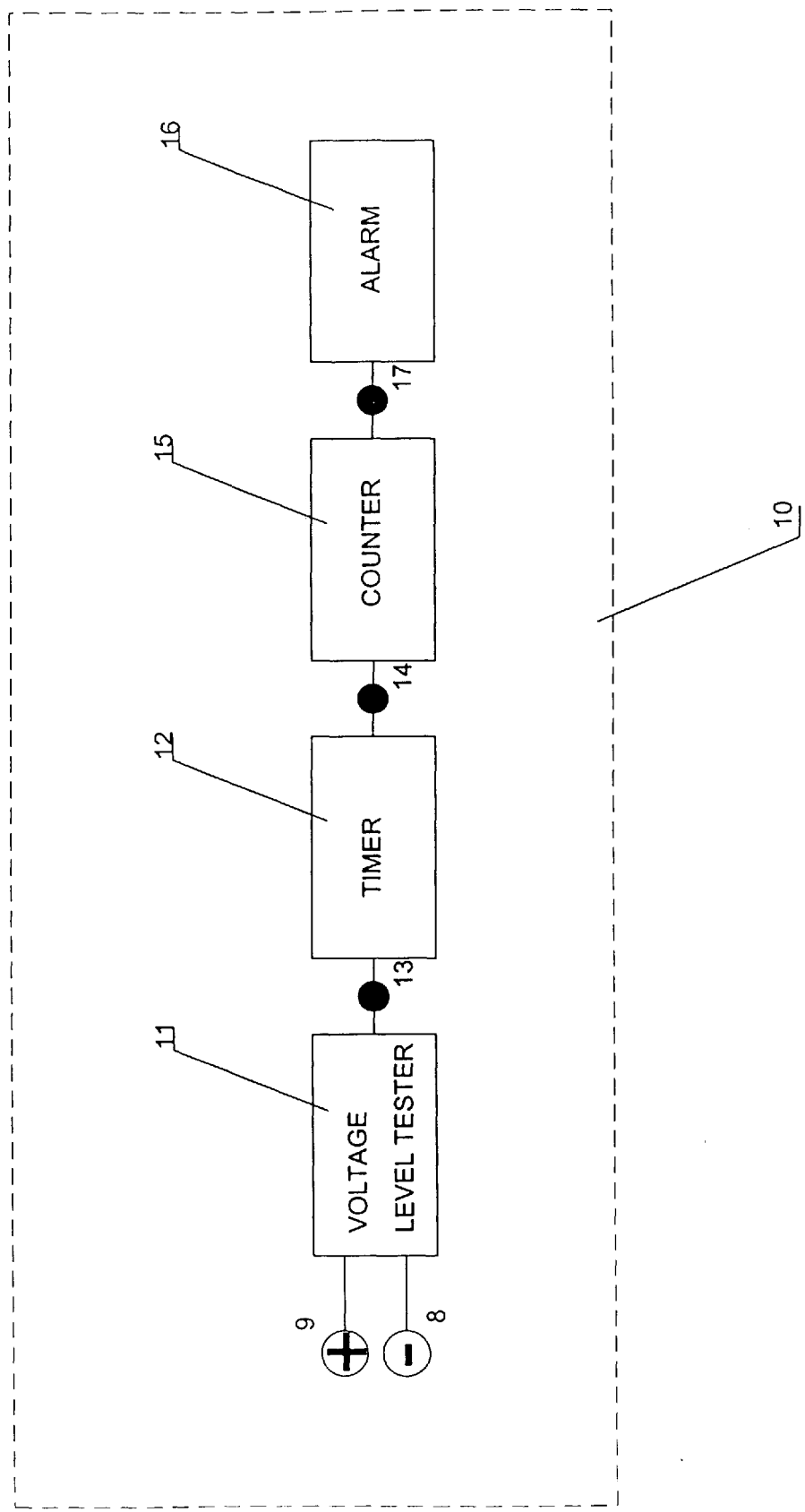
FIGURE

DEVICE FOR WARNING OF VEHICLE BATTERY DETERIORATION

This application is a continuation of U.S. patent application Ser. No. 08/625,497, filed Mar. 29, 1996, now abandoned.

FIELD AND BACKGROUND OF THE INVENTION

The present invention relates to monitoring of electrical components and, in particular, it concerns a device and a method for warning of deterioration of a starter mechanism for a combustion engine.

It is known that vehicle batteries, such as those used to drive a starter motor for a combustion engine, have a limited life-span and must eventually be replaced. Typically, replacement is only performed once the battery is no longer able to start the vehicle. This situation may arise when the vehicle operator is in a hurry, during rain and cold weather, and especially at holiday times when garages are closed or when one is a long distance from help. Battery failure is therefore a common source of aggravation for vehicle operators.

A number of techniques have been proposed to identify when the battery may fail to start the motor. One technique is to measure the specific gravity of the electrolyte within the battery. This measurement demands professional workers.

Another technique is the measurement of the internal resistance of the battery through various methods. This system also demands technical/professional knowledge and/or workers.

A further technique is continuous measurement and display of the voltage of the battery during the entire life of the battery.

An alternative technique measures the internal resistance of the battery. This method causes high consumption of energy and heating of the battery which makes sparks and can cause damage if non-technical workers check the battery. An example of such a system is disclosed in U.S. Pat. No. 5,339,017 to Yang which describes a device for checking the vehicle's battery's charge state. This device checks the battery's charge by measuring the internal resistance, indirectly. This is done by the voltage measurement of a capacitor which is charged by the battery. The measurement is performed at a predetermined time. If the voltage which was measured on the capacitor is higher, the internal resistance is smaller. The device visually displays the capacitor's voltage, thereby indicating the internal resistance which in turn shows the condition of the charge of the battery.

There is therefore a need for a device for warning when a vehicle battery is about to run out, but is still able to start the motor, thereby allowing the vehicle operator to drive unaided to the maintenance center. It would also be advantageous to have a device which indicates a fault in one of the elements shared in the operation of starting the vehicle, rather than just checking the electrical power of the battery as is done in other systems.

SUMMARY OF THE INVENTION

The present invention is a device and a method for warning of deterioration of a starter mechanism for a combustion engine.

According to the teachings of the present invention there is provided, a device for warning of deterioration of a starter mechanism in which a motor is powered by a battery to start a combustion engine, the device comprising: (a) a timer responsive to activation of the starter mechanism to time a given time interval; (b) a voltage level tester associated with the timer for measuring a voltage across the battery at the end of the given time interval; (c) a counter associated with the voltage level tester, the counter maintaining an incremental count of occasions on which the voltage is below a given level; and (d) an alarm unit for providing a warning signal when the incremental count exceeds a given number.

According to a further feature of the present invention, the voltage level tester measures the voltage across the battery continuously, and wherein the timer identifies activation of the starter mechanism by a corresponding sudden drop in voltage across the battery.

According to a further feature of the present invention, the given time interval is greater than the time normally taken by the motor to start rotating.

According to a further feature of the present invention, the given time interval is less than the time normally taken by the combustion engine to reach a state in which it can run without further aid from the starter mechanism.

According to a further feature of the present invention, there is also provided a temperature sensor associated with the voltage level tester for measuring the ambient temperature in the vicinity of the starter mechanism, and wherein the given voltage level varies in relation to the ambient temperature.

According to a further feature of the present invention, there is also provided a temperature sensor associated with the timer for measuring the ambient temperature in the vicinity of the starter mechanism, and wherein the timer is responsive to the temperature sensor to vary the given time interval.

According to a further feature of the present invention, the alarm unit generates a warning signal including an audible alarm.

According to a further feature of the present invention, the alarm unit generates a warning signal including a visible signal.

There is also provided, according to the teachings of the present invention, a method for warning of deterioration of a starter mechanism in which a motor is powered by a battery to start a combustion engine, the method comprising the steps of: (a) sensing activation of the starter mechanism; (b) when a given time interval has elapsed since the activation, measuring a voltage across the battery; (c) incrementing a count in the event that the voltage is below a given level; and (d) providing a warning signal when the count exceeds a given number.

According to a further feature of the present invention, the step of sensing is performed by identifying a drop in voltage across the battery.

According to a further feature of the present invention, the given time interval is greater than the time normally taken by the motor to start rotating.

According to a further feature of the present invention, the given time interval is less than the time normally taken by the combustion engine to reach a state in which it can run without further aid from the starter mechanism.

According to a further feature of the present invention, there is also provided a step of measuring the ambient temperature in the vicinity of the starter mechanism, and wherein the given voltage level varies in relation to the ambient temperature.

According to a further feature of the present invention, there is also provided a step of measuring the ambient temperature in the vicinity of the starter mechanism, and wherein the given time interval varies in relation to the ambient temperature.

According to a further feature of the present invention, the warning signal includes an audible alarm.

According to a further feature of the present invention, the warning signal includes a visible signal.

BRIEF DESCRIPTION OF THE DRAWINGS

The invention is herein described, by way of example only, with reference to the accompanying FIGURE which shows a block diagram of a device, constructed and operative according to the teachings of the present invention, for warning of deterioration of a starter mechanism for a combustion engine,

DESCRIPTION OF THE PREFERRED EMBODIMENTS

The present invention is of a device and a method for warning of deterioration of a starter mechanism for a combustion engine.

The principles and operation of a device and a method according to the present invention may be better understood with reference to the drawing and the accompanying description.

Referring now to the Figure, there is shown a device, generally designated 10, constructed and operative according to the teachings of the present invention, for warning of deterioration of a starter mechanism for a combustion engine.

Generally speaking, device 10 checks the power of the battery automatically when starting the motor. The device is permanently connected to the positive and negative poles of the battery. The device uses the principle that the battery needs to supply a large current to the motor's starter.

The starter is a changeable mechanical load. Until the starter turns, the mechanical load is very small. When the starter is turned on, the mechanical load increases and so the voltage level on the battery pole changes, according to the mechanical load of the starter.

At the time of the vehicle's starting, the device measures the voltage on the battery's pole and compares the voltage to a predetermined level. This measurement is done when the starter is connected to the battery and is turning. At the time of the connection of the starter to the battery there is a sharp drop of the voltage on the battery poles. The device identifies the drop of the voltage and the timer begins to work. The timer allows another measurement of the voltage after a predetermined time and then compares the voltage of the battery's poles to a predetermined voltage level. In this measurement (after a predetermined time) the starter is in a turning state. If the voltage at the time of the starter's turning is less that a predetermined voltage level, there is a meter that counts every time this happens. When this phenomenon occurs more than a number of predetermined times the counter makes a signal unit to signalling. Thus the vehicle's user will know when he can still use his car to drive to the maintenance center in order to replace the battery.

Turning now to the features of device 10 in more detail, the Figure shows device 10, comprising a voltage level tester 11. A timing means 12 has a first terminal connected to the output of the voltage level tester 13 and a second terminal 14 connected to a counter unit 15. The input of the counter connected to terminal 14 and the output of the counter connected to alarm unit 16 by terminal 17. The voltage level tester connected also to the vehicle battery by terminal 9 to the positive pole and by terminal 8 to the negative pole.

The voltage level tester 11 is connected at three terminals: terminal 8 to the negative pole of the battery, terminal 9 to the positive pole of the battery, and when the battery voltage drops below the predetermined level, the voltage level tester detects the fall of the voltage level and applied voltage to terminal 13. This happens when the car's starter begins to turn.

Optionally, device 10 may include a temperature sensor (not shown). In this case, voltage level tester 11 is responsive to the temperature sensor to set the predetermined voltage level according to the ambient temperature. Alternatively, or additionally, timer 12 may be responsive to the temperature sensor to set the predetermined time period.

A timer 12 responds to the voltage applied by the voltage level tester for connecting the first terminal 13 to second terminal 14 after a predetermined time period. At this time, the starter is already turning. The counter 15 responds to a voltage applied by the timer by terminal 14 and counts every time that the voltage of the battery is below a predetermined level for a predetermined time period.

An alarm unit is connected to terminal 17 and produces a warning signal after a given number of times that the counter counts. The warning signal may be audible or visible.

As will already be understood, an object of the invention is to provide a warning device which signals or warns when the electrical power of the battery reaches a predetermined level. The battery will not be able to ignite/start the car motor for long, below this level.

An advantage of our system in the testing of the battery is that in our system the test is a direct test of the ability of a specific car battery to start the vehicle. In our system, the test is done each time the starter is operated, without the intervention of maintenance workers, and is not an average value of internal resistance as is determined by other systems.

By way of example, when the mechanical system of the motor becomes damaged, it is difficult to start the starter, because of high mechanical loads, despite the fact that the battery is working. The start will cause a large drop of the voltage level on the battery poles. Therefore, the device will identify problems in the ability to start the vehicle, even if the battery is electrically workable. This allows identification and repair of mechanical faults and increases the life span of the battery.

The system will naturally identify the battery's condition which is about to be electrically emptied when the other systems are in good working order.

Because the system checks the starting voltage at the time of starting the vehicle, the identification/discovery of the drop of voltage level on the battery poles indicates a fault in at least one of the elements shared in the operation of starting the car, and not just checking the electrical power of the battery as is done in other systems.

It will be appreciated that the above descriptions are intended only to serve as examples, and that many other embodiments are possible within the spirit and the scope of the present invention.

What is claimed is:

1. A device for warning of deterioration of a starter mechanism in which a motor is powered by a battery to start a combustion engine, the device comprising:

(a) a voltage level tester connected so as to measure a voltage across the battery;

(b) a timer operatively connected to said voltage level tester so as to be actuated in response to a sudden drop in said voltage to time a given time interval;

(c) a counter operatively connected to said timer so as to be actuated exclusively at the end of said given time period, said counter further being associated with said voltage level tester so as to maintain an incremental count of occasions on which said voltage is below a given level at the end of said given time interval; and (d) an alarm unit for providing a warning signal when said incremental count exceeds a given number.

2. A device as in claim 1, wherein said given time interval is greater than the time normally taken by the motor to start rotating.

3. A device as in claim 1, wherein said given time interval is less than the time normally taken by the combustion engine to reach a state in which it can run without further aid from the starter mechanism.

4. A device as in claim 1, further comprising a temperature sensor associated with said voltage level tester for measuring the ambient temperature in the vicinity of the starter mechanism, and wherein said given voltage level varies in relation to said ambient temperature.

5. A device as in claim 1, further comprising a temperature sensor associated with said timer for measuring the ambient temperature in the vicinity of the starter mechanism, and wherein said timer is responsive to said temperature sensor to vary said given time interval.

6. A device as in claim 1, wherein said alarm unit generates a warning signal including an audible alarm.

7. A device as in claim 1, wherein said alarm unit generates a warning signal including a visible signal.

8. A method for warning of deterioration of a starter mechanism in which a motor is powered by a battery to start a combustion engine, the method comprising the steps of:

(a) sensing activation of the starter mechanism;

(b) when a given time interval has elapsed since said activation, measuring a voltage across the battery;

(c) maintaining a cumulative count of the number of occasions on which said voltage is below a given level at the end of said time interval; and (d) providing a warning signal when said count exceeds a given number.

9. A method as in claim 8, wherein said step of sensing is performed by identifying a drop in voltage across the battery.

10. A method as in claim 8, wherein said given time interval is greater than the time normally taken by the motor to start rotating.

11. A method as in claim 8, wherein said given time interval is less than the time normally taken by the combustion engine to reach a state in which it can run without further aid from the starter mechanism.

12. A method as in claim 8, further comprising the step of measuring the ambient temperature in the vicinity of the starter mechanism, and wherein said given voltage level varies in relation to said ambient temperature.

13. A method as in claim 8, further comprising the step of measuring the ambient temperature in the vicinity of the starter mechanism, and wherein said given time interval varies in relation to said ambient temperature.

14. A method as in claim 8, wherein said warning signal includes an audible alarm.

15. A method as in claim 8, wherein said warning signal includes a visible signal.

\* \* \* \* \*